(12) United States Patent
Lee et al.

(10) Patent No.: US 7,196,542 B1
(45) Date of Patent: Mar. 27, 2007

(54) TECHNIQUES FOR PROVIDING INCREASED FLEXIBILITY TO INPUT/OUTPUT BANKS WITH RESPECT TO SUPPLY VOLTAGES

(75) Inventors: Andy Lee, San Jose, CA (US); Toan Nguyen, San Francisco, CA (US); Stephanie Tran, San Jose, CA (US); Cameron McClintock, Mountain View, CA (US); Brian Johnson, Bellevue, WA (US)

(73) Assignee: Altera Corporation, San Jose, CA (US)

( * ) Notice: Subject to any disclaimer, the term of this patent is extended or adjusted under 35 U.S.C. 154(b) by 67 days.

(21) Appl. No.: 10/977,332

(22) Filed: Oct. 28, 2004

(51) Int. Cl.
*H03K 19/173* (2006.01)
(52) U.S. Cl. .............................. 326/38; 326/41; 326/82
(58) Field of Classification Search ............. 326/37–41
See application file for complete search history.

(56) References Cited

U.S. PATENT DOCUMENTS

| | | | |
|---|---|---|---|
| 6,246,258 B1 * | 6/2001 | Lesea .......................... 326/39 |
| 6,271,679 B1 * | 8/2001 | McClintock et al. ......... 326/38 |
| 6,377,069 B1 * | 4/2002 | Veenstra et al. .............. 326/38 |
| 6,480,026 B2 * | 11/2002 | Andrews et al. .............. 326/39 |
| 6,864,710 B1 * | 3/2005 | Lacey et al. .................. 326/39 |

* cited by examiner

*Primary Examiner*—Don Le
(74) *Attorney, Agent, or Firm*—Townsend and Townsend and Crew LLP

(57) ABSTRACT

Techniques are provided for increasing flexibility to I/O banks with respect to supply voltages. Multiple supply voltages can be provided to a bank of I/O pins. Separate I/O pins residing in an I/O bank are driven by buffers that are coupled to different supply voltages. Dedicated I/O pins are driven by buffers with pre-selected supply voltages. The dedicated I/O pins can be grouped together into the same I/O bank providing greater flexibility to drive signals on I/O pins in other I/O banks at different voltages. Also, a dual mode input buffer can drive an input signal to a voltage determined by one of two possible supply voltage levels. In addition, power on reset circuits for an I/O bank can monitor the voltage of two or more supply voltages.

20 Claims, 4 Drawing Sheets

TECHNIQUES FOR PROVIDING INCREASED FLEXIBILITY TO INPUT/OUTPUT BANKS WITH RESPECT TO SUPPLY VOLTAGES

BACKGROUND OF THE INVENTION

The present invention relates to techniques for providing increased flexibility to input/output banks with respect to supply voltages, and more particularly, to techniques for allowing an integrated circuit to operate its input and output pins at multiple supply voltages.

In programmable logic devices (PLDs) and field programmable gate arrays (FPGAs), it is common for external terminals of the integrated circuit to be grouped into banks that have independent power supply voltages. For example, a PLD can have 8 banks of external terminals, two banks along each edge of the chip. All of the external terminals in one bank are powered by the same power supply voltage. External terminals of an integrated circuit are often referred to as input/output (I/O) pins.

A PLD uses some of its I/O pins to interface with external configuration and testing devices. The I/O pins used for configuration and testing are mingled with other I/O pins across multiple I/O banks on a single integrated circuit. Because all pins in an I/O bank operate at the same supply voltage, buffers that drive I/O pins used for configuration must operate at the same supply voltage level as buffers that drive other pins in the I/O bank not used for configuration. Because the configuration I/O are spread across multiple I/O banks, all of these I/O banks are locked into operating at the same supply voltage level as the external configuration or testing device.

I/O pins not used for configuration and testing are typically placed in multiple I/O banks so that these I/O pins can operate at different supply voltage levels and different I/O standards. The value of placing I/O pins in multiple banks is greatly reduced if many of the I/O banks are restricted to operating at the supply voltage level of an external configuration or testing device.

Some PLD customers address this problem by using one power supply voltage for a pin in configuration mode and a different power supply voltage for that pin in user mode. However, this technique is not a desirable solution, because it requires the power supply to a pin to dynamically change voltage.

Another technique customers use to address this problem is to have off-chip voltage translators convert configuration voltage values for the supply voltage of an I/O bank. However, this technique is not desirable, because it requires a significant amount of additional board space.

Therefore, it would be desirable to provide techniques for providing increased flexibility to I/O banks with respect to supply voltages without requiring a large amount of board space or limiting the operation of the circuit.

BRIEF SUMMARY OF THE INVENTION

The present invention provides techniques for providing increased flexibility to I/O banks with respect to supply voltages. According to one embodiment of the present invention, multiple supply voltages are provided to a bank of I/O pins on an integrated circuit. Separate I/O pins residing in an I/O bank are driven by buffers that are coupled to different supply voltages. Dedicated testing I/O pins can be driven by buffers with pre-selected supply voltages.

According to another embodiment of the present invention, all of the dedicated configuration output pins are grouped together into the same I/O bank. This embodiment allows greater flexibility to drive signals on I/O pins in other I/O banks to different voltages. According to another embodiment of the present invention, a dual mode input buffer can drive an input signal to a voltage determined by one of two possible supply voltage levels. According to yet another embodiment of the present invention, power on reset circuits for an I/O bank monitor the voltage of two or more supply voltages.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
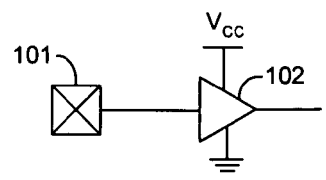
FIG. 1A illustrates an example of an input buffer coupled to an I/O pin.

FIG. 1A illustrates a simple example of an input buffer 102 coupled to receive signals applied from an external source to an I/O pin 101 of an integrated circuit. Buffer 102 is driven by supply voltage $V_{CC}$, which is a constant, regulated supply voltage.

Input buffer 102 is designed to operate in situations in which the voltage range of the input signal applied to pin 101 is the same or about the same as the supply voltage $V_{CC}$. If the voltage range of the signal applied to pin 101 is significantly larger than $V_{CC}$, buffer 102 is still able to drive the signal at pin 101, although the timing relationship between the output signal of buffer 102 and the input signal at pin 101 may change.

On the other hand, buffer 102 is not able to successfully drive an input signal at pin 101 that is smaller than $V_{CC}$. For example, assume input buffer 102 is a standard CMOS buffer. If $V_{CC}$ is 3.3 volts and the voltage range of the input signal applied to pin 101 is 1.5 volts, the signal at pin 101 never gets high enough to turn off the p-channel transistor in buffer 102. Therefore, the output signal of buffer 102 cannot be pulled all the way to ground. Thus, an input buffer 102 can drive input signals larger than its supply voltage, but not smaller than its supply voltage.

Figure 1B:
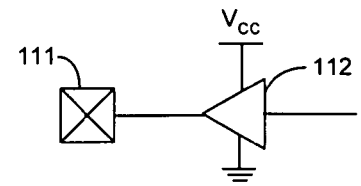
FIG. 1B illustrates an example of an output buffer coupled to an I/O pin.

FIG. 1B illustrates a simple example of an output buffer 112 coupled to drive output signals from an integrated circuit to an I/O pin 111 of an integrated circuit. Buffer 102 is driven by supply voltage $V_{CC}$. Output buffer 112 cannot drive signals to I/O pin 111 that have voltage amplitudes larger than $V_{CC}$, because buffer 112 is not able to pull the voltage at pin 111 higher than $V_{CC}$. To meet an IO standard, an output buffer must drive at specific voltage levels.

Figure 2:
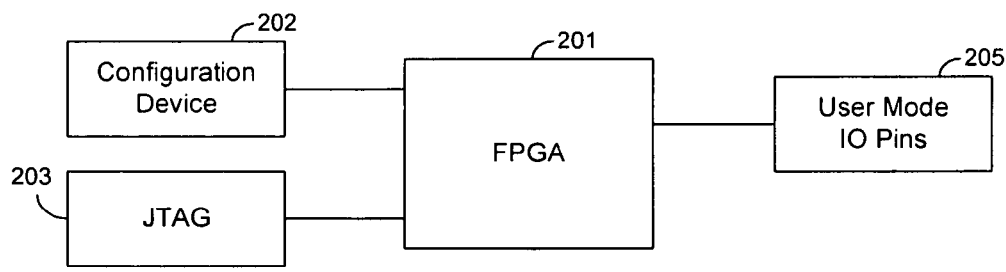
FIG. 2 illustrates an example of an FPGA coupled to an external configuration device and an external JTAG test device.

The limitations discussed above with respect to input buffers and output buffers can cause problems in integrated circuits such as FPGAs that need to drive multiple pins in an I/O bank at more than one supply voltage. FIG. 2 illustrates an example of this problem. FPGA 201 is a programmable logic integrated circuit that is configured by configuration data stored in an off-chip memory device 202. The configuration data is transferred from configuration device 202 to FPGA 201 through I/O pins on FPGA 201. Programmable logic circuits in FPGA are configured by the configuration data in a state referred to as configuration mode. FPGA 201 also communicates with user mode IO pins 205.

Once FPGA 201 has been configured, FPGA 201 operates according to the user functions specified by the configuration data. This mode is referred to as user mode. The FPGA may use several of its I/O pins to send and receive data from IO pins 205 during the user mode. If the buffers coupled to pins in the same I/O bank are driven by the same supply voltage, and the configuration pins are spread throughout several I/O banks, all of the pins in these I/O banks are limited to operating at the configuration voltage. This constraint limits the number of pins FPGA 201 can use at a different supply voltage during the user mode.

FPGA 201 is also coupled to joint test action group (JTAG) test device 203. FPGA 201 transmits test data to and from JTAG device 203 through one or more I/O pins of FPGA 201. Output buffers that drive JTAG output pins on the FPGA are constrained by the voltage of the signals sent to and from JTAG device 203. If all of the buffers coupled to pins in the same I/O bank are driven by the same supply voltage, placing one JTAG output pin in an I/O bank constrains all of the pins in that I/O bank to operating at the same supply voltage. This constraint also limits the number of pins that FPGA 201 can use at a different supply voltage during the user mode.

Figure 3:
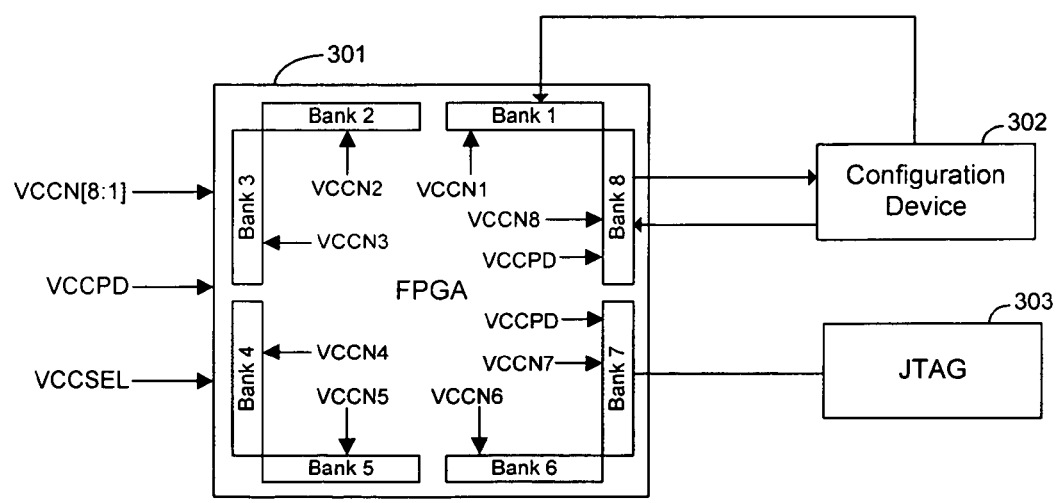
FIG. 3 illustrates an example of an FPGA that has all of its configuration output pins in one I/O bank, according to an embodiment of the present invention.

FIG. 3 illustrates an embodiment of the present invention that allows an FPGA to use more of its I/O pins at voltage levels different than the voltage levels used by external configuration and test devices. FPGA 301 has eight I/O banks numbered 1–8. Each I/O bank has several I/O pins. Eight I/O banks are illustrated in FIG. 3 merely as example. This example is not intended to limit the scope of the present invention. One of skill in the art will understand that the principles of the present invention apply to FPGAs with any number of I/O pins and I/O banks.

Many of the I/O pins on FPGA 301 are driven by at least one input buffer and/or at least one output buffer. The buffers in each I/O bank in FPGA 301 are driven by a supply voltage. I/O banks 1–8 are driven by supply voltages VCCN1–VCCN8, respectively. Supply voltages VCCN1–VCCN8 are applied to the FPGA from an external source. Each of the supply voltages VCCN1–VCCN8 can be an independent voltage. Alternatively, some of the voltages can be tied together.

According to an embodiment of the present invention, the configuration output pins are not driven by one of the bank voltages VCCN1–VCCN8. Instead, the output pins used during configuration mode are driven by another supply voltage VCCPD. Supply voltage VCCPD is provided to any of the I/O banks that contain configuration output pins. For example, chip enable output pin NCEO can be driven by an output buffer that is coupled to receive VCCPD. As another example, JTAG output pins such as TDO can be driven by an output buffer that is coupled to receive supply voltage VCCPD.

According to another aspect of the present invention, all of the output pins on FPGA 301 that transmit data to configuration device 302 are located in I/O bank 8. All of the buffers coupled to the pins in bank 8 are driven by the same supply voltage VCCN8. Configuration device 302 receives data from FPGA 301 only through output pins in bank 8. In order for the output buffers coupled to these input pins to operate properly, the output buffers are driven by a supply voltage VCCN8 that is equal to or about equal to the voltage range required by configuration device 302 (e.g., 3.3 volts). The required VCCN8 for IO bank 8 can depend on what the configuration mode of the FPGA is.

According to another embodiment of the present invention, supply voltages VCCN1–VCCN7 for I/O banks 1–7 on the FPGA only need to receive a supply voltage required for low voltage operation (e.g., 1.5/1.8 volts). According to another embodiment, I/O banks 1–7 do not have any output pins that are required to be driven by bank voltages VCCN1–VCCN7 in a basic configuration mode.

According to another aspect of the present invention, the input pins on FPGA 301 that receive configuration data from configuration device 302 can be located in any of the 8 I/O banks. FPGA 301 receives configuration data from configuration device 302 through input pins located in any of the I/O banks. For example, FIG. 3 shows configuration device 302 transmitting configuration data to input pins in banks 8 and 1. Configuration device 302 can also transmit configuration data to input pins in I/O banks 2–7.

As discussed above, input buffers can operate at a supply voltage that is less than or equal to the voltage range of the input signals received at their input pins. Because input buffers are more flexible, the configuration input pins can be placed in any I/O bank without significantly constraining the supply voltage of that I/O bank. For example, if VCCN1 is 1.5 volts, input pins in bank 1 can receive signals with a range of 1.5, 1.8, 2.5, and 3.3 volts.

The present invention provides increased flexibility to FPGA 301, because the input and output buffers coupled to the pins in banks 1–7 are not constrained by the supply voltage needed to drive the configuration output pins in I/O bank 8. Because all of the output pins that transmit data to configuration device 302 are placed in bank 8, the supply voltages VCCN1–VCCN7 that drive the buffers in banks 1–7 are independent of the supply voltage of configuration device 302. Therefore, FPGA 301 can drive signals at any desired voltage to pins in I/O banks 1–7 during user mode.

An FPGA can also have optional pins that constrain the supply voltage provided to an I/O bank. According to the present invention, all optional I/O pins are constrained to one I/O bank, or at least a minimum number of I/O banks on a chip. For example, FPGA 301 may have programming PGM pins that are used to address an external Flash device. FPGA 301 may also have output pins used for error checking such as cyclic redundancy checking. These examples are illustrative and not intended to limit the scope of the present invention. The optional pins may be constrained by the voltage requirements of an external device. All of the optional pins are placed in I/O bank 8, because they typically require the same supply voltage as the configuration pins (e.g., 3.3. volts).

Another example of a pin is an open collector output pin. The voltage at an open collector output pin is pulled to ground through an on-chip n-channel transistor. The voltage amplitude of the signal driven to the pin is determined by an off-chip supply voltage through an external resistor. The FPGA is not limited to driving a signal at an open collector output pin to an on chip supply voltage value. Therefore, an open collector output pin can be placed in any I/O bank on FPGA 301, because it does not constrain the power supply provided to the other pins. NSTATUS and CONDONE are examples of open collector output pins. NSTATUS is a configuration output pin that indicates the status of the configuration mode, and CONDONE is an output pin that indicates when the configuration mode is finished.

JTAG output pins located in I/O bank 7 of FPGA 301 are used to drive test signals to JTAG device 303. Bank 7 receives two supply voltages, VCCN7 and VCCPD. VCCPD is a supply voltage that is generated externally and transmitted to FPGA 301. Buffers that are coupled to pins in bank 7 can be driven by supply voltage VCCN7 or by supply voltage VCCPD.

Figure 4:
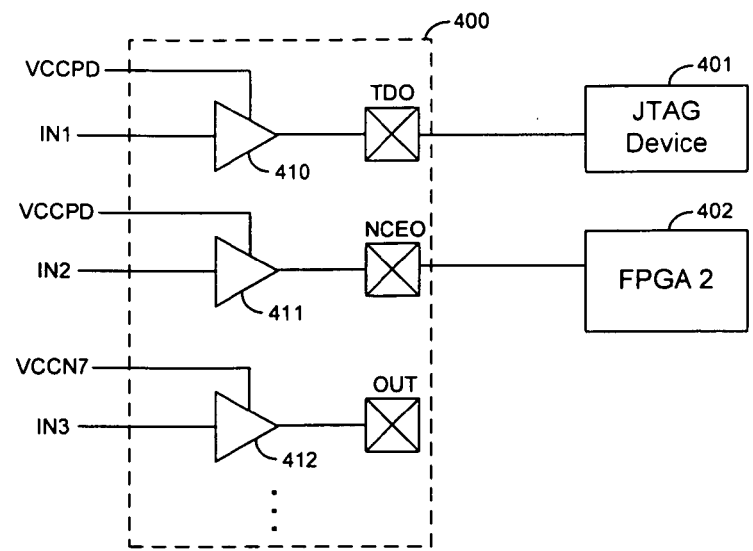
FIG. 4 illustrates an example of how buffers that drive pins in the same I/O bank can be driven by different supply voltages, according to an embodiment of the present invention.

FIG. 4 illustrates an example of how output buffers that drive output pins in I/O bank 7 can be coupled to receive a supply voltage VCCPD other than bank supply voltage VCCN7. I/O bank 400 in FIG. 4 is an example of I/O bank 7 in FIG. 3. I/O bank 400 includes several I/O pins. Only 3 I/O pins are shown in FIG. 4 so as not to overcomplicate the drawing.

Bank 400 includes standard configuration pins JTAG pin TDO and a chip enable pin NCEO. According to one embodiment, standard configuration pins such as JTAG and chip enable pins are constrained to one I/O bank, or at least to a minimum number of I/O banks. If desired, the standard configuration pins can be placed in the same I/O bank as the optional pins.

All JTAG pins are required to be at a set voltage (e.g., 3.3. volts). Voltage VCCPD matches the supply voltage of JTAG device 401. Pin TDO is a JTAG output pin that is dedicated to driving output signals to external JTAG device 401. Output buffer 410 drives output signals from the FPGA to JTAG pin TDO. Output buffer 410 is driven by supply voltage VCCPD (e.g., 3.3 volts).

Pin NCEO (negative logic chip enable) is used when multiple FPGAs are cascaded together in a daisy chained fashion. The output signal driven to the NCEO pin indicates when the current FPGA has been programmed, and the next FPGA 402 in the daisy chain can be programmed. Output buffer 411 drives signals from the FPGA to pin NCEO. Output buffer 411 is driven by supply voltage VCCPD.

Output pin OUT is driven by output buffer 412. Output buffer 412 is driven by supply voltage VCCN7. I/O bank 7 has additional pins that are driven by input and output buffers. These additional input and output buffers are driven by supply voltage VCCN7 or VCCPD. Bank 400 can also include pins that are dedicated for receiving input signals from JTAG device 401.

The embodiment of FIG. 4 allows an FPGA to operate dedicated JTAG pins at a supply voltage required by external JTAG device 401. At the same time, the embodiment of FIG. 4 allows the FPGA to drive other pins in the same I/O bank at a different supply voltage. The flexibility provided by this embodiment allows signals to be driven to pins in I/O bank 400 during user mode at a supply voltage different than the supply voltage used by the dedicated JTAG output pins.

Figure 5:
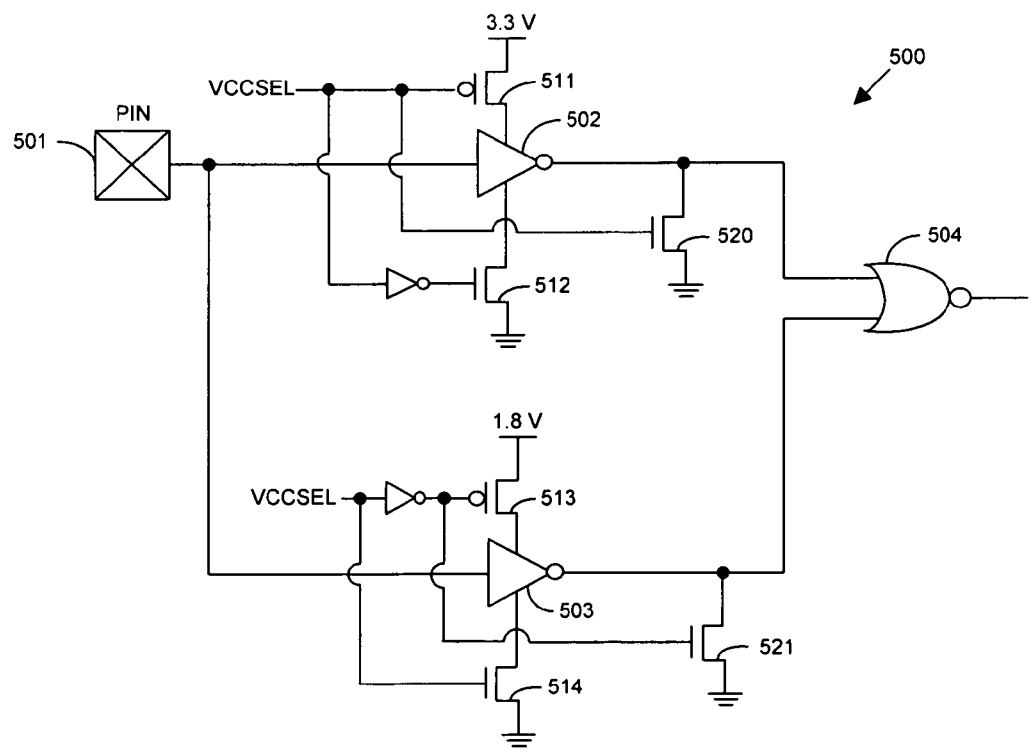
FIG. 5 illustrates a dual mode input buffer that operates at one of two possible supply voltages, according to an embodiment of the present invention.

FIG. 5 illustrates a dual mode input buffer 500 according to a further embodiment of the present invention. Input buffer 500 is coupled to an I/O pin 501. Input buffer 500 is designed to drive input signals received at pin 501 using inverting input buffer 502 or inverting input buffer 503. Inverting input buffers 502 and 503 can be standard CMOS buffers that are driven by different supply voltages. Input buffer 502 is driven by a 3.3 volt supply voltage, and input buffer 503 is driven by a 1.8 volt supply voltage. These voltages are given merely as examples. Input buffers 502 and 503 can be driven to other voltage values.

VCCSEL is a supply voltage select signal that is generated externally and driven into the FPGA as shown in FIG. 3. VCCSEL selects which of input buffers 502 or 503 is enabled to drive input signals received at pin 501. Input buffers 502 and 503 are never enabled at the same time. When the voltage of VCCSEL is a logic low, transistors 511, 512, and 521 are on, and transistors 513, 514, and 520 are off. When transistors 511 and 512 are on, buffer 502 is enabled, because current flows through buffer 502 between the supply voltage and ground. When transistors 513 and 514 are off, buffer 503 is disabled, because transistors 513 and 514 block current flow between the supply voltage and ground. When transistor 521 is on, the output of buffer 503 is pulled to ground.

VCCSEL is driven low if the signal received at pin 501 has a voltage range of 3.3 volts (or 2.5 volts). If the signal driven to pin 501 has a voltage range of 1.8 volts (or 1.5 volts), VCCSEL is driven high. When VCCSEL is high, buffer 503 is enabled, buffer 502 is disabled, transistor 521 is off, and transistor 520 is on, pulling the output of buffer 502 to ground. The output signals of buffers 502 and 503 are combined into one signal by NOR gate 504.

Dual mode buffer 500 provides the flexibility of receiving input signals that are one of two possible voltages. Buffer 500 is useful for receiving input signals at one voltage during configuration mode and receiving input signals at a different voltage during user mode.

Figure 6:
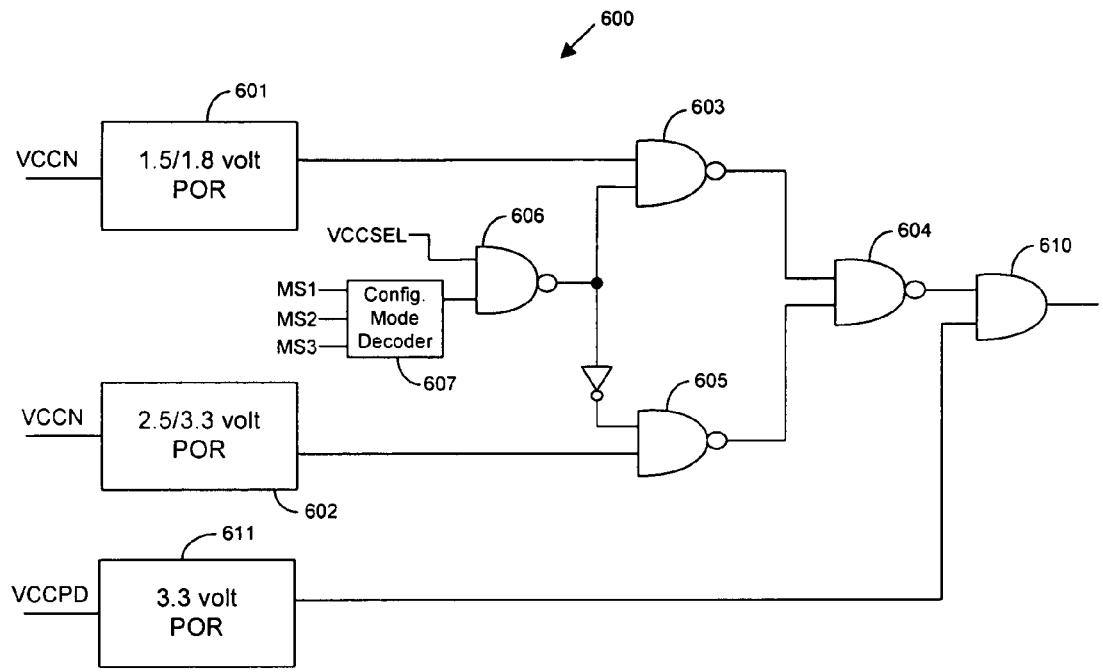
FIG. 6 illustrates a power on reset monitoring circuit for an I/O bank, according to an embodiment of the present invention.

FIG. 6 illustrates a circuit 600 that monitors the supply voltages that are applied to an I/O bank, according to a further embodiment of the present invention. Power on reset (POR) circuit 601 and power on reset circuit 602 both monitor power supply voltage VCCN. POR circuit 601 determines when VCCN reaches a voltage level required for 1.5 or 1.8 volt IO operation. When VCCN reaches the selected voltage level, POR circuit 601 generates a high output signal at an input of NAND gate 603.

POR circuit 602 determines when VCCN reaches a voltage level required for 2.5 or 3.3. volt 10 operation. When VCCN reaches the selected voltage level, POR circuit 602 generates a high output signal at an input of NAND gate 605.

NAND gate 606 receives signal VCCSEL and the output of configuration mode decoder 607. Signals MS1–MS3 are encoded control signals that specify the configuration mode. Signals MS1–MS3 are decoded by configuration mode decoder 607. Voltage VCCSEL selects the supply voltage used for configuration of the device.

When the output of NAND gate 606 is high, the output of NAND gate 605 is high, regardless of the output of POR 602. The output of NAND gate 604 is low when the output of POR 601 is low. After the output of POR 601 goes high indicating VCCN has reached the voltage required for 1.5/1.8 volt IO operation, the output of NAND gate 604 also transitions high.

When the output of NAND gate 606 is low, the output of NAND gate 603 is high, regardless of the output of POR 601. The output of NAND gate 604 is low when the output of POR 602 is low. After the output of POR 602 goes high indicating VCCN has reached the voltage required for 2.5/3.3 volt IO operation, the output of NAND gate 604 also transitions high.

Signals VCCSEL and MS1–MS3 select which of the POR circuits (601 or 602) is enabled by NAND gates 603–605. The output signal of NAND gate 604 is the same logic value as the output signal of the selected POR circuit (601 or 602). Thus, the circuit of FIG. 6 allows a user to select the supply voltage that a POR circuit compares against VCCN by setting the value of the VCCSEL or the MS1–MS3 signals. This feature is useful for I/O banks where the POR voltage is dependent upon configuration mode. The output signal of NAND gate 604 indicates whether VCCN has reached the selected supply voltage level.

Monitor circuit 600 also has a POR circuit 611 that monitors supply voltage signal VCCPD. When VCCPD has reached the voltage required for 3.3 volt IO operation, the output signal of POR 611 goes high. When the output of POR 611 is high and the output of NAND gate 604 is high, the output signal of AND gate 610 is also high.

The output signal of AND gate 610 is high when VCCPD has reached the voltage required for 3.3 volt IO operation, and VCCN has reached the voltage required for the IO operation mode selected by VCCSEL (1.5/1.8 volts or 2.5/3.3 volts). Thus, the output signal of AND gate 610 indicates when both supply voltages VCCN and VCCPD have reached their desired values.

Figure 7:
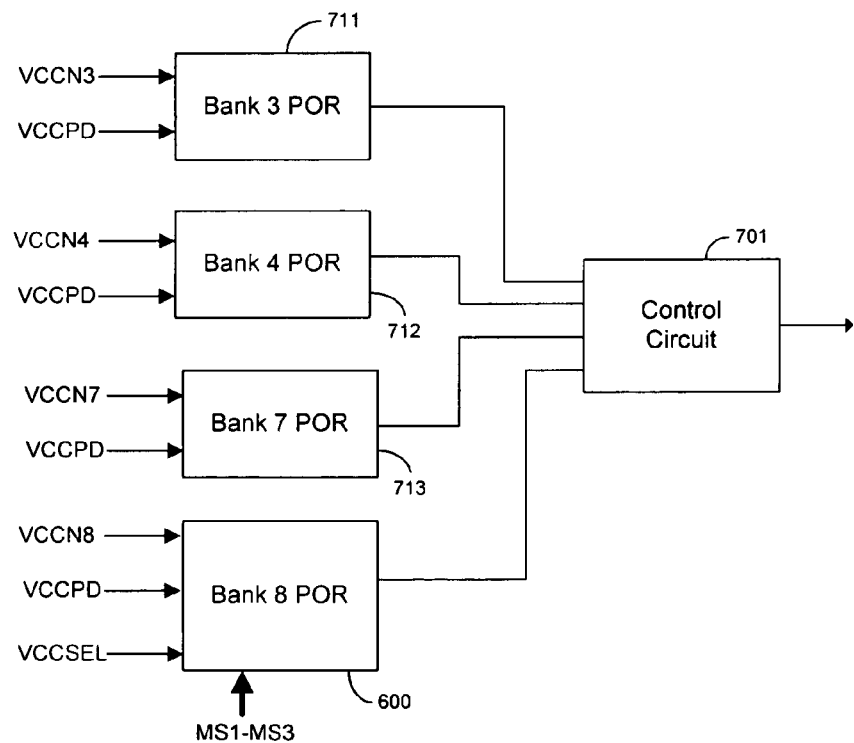
FIG. 7 illustrates how a control circuit monitors the output signals of POR circuits for several I/O banks, according to an embodiment of the present invention.

FIG. 7 illustrates how a group of POR circuits on an FPGA are monitored by a control circuit 701 according to an embodiment of the present invention. POR circuits 711, 712, 713, and 600 correspond to I/O banks 3, 4, 7, and 8, respectively. In this embodiment, I/O bank 8 has a dual mode buffer 500. Each of 4 the POR circuits are monitored by control circuit 701. The output signals of POR circuits 711–713 and 600 transition high when supply voltages VCCN[3, 4, 7, 8] and VCCPD reach their desired values. Each of POR circuits 711–713 can have two separate power on reset monitoring circuits, one for monitoring each supply voltage VCCN[3, 4, 7, 8] and VCCPD.

Typically, POR circuits 711–713 and 600 monitor when supply voltages VCCN[3, 4, 7, 8] reach the voltage required for the same IO operation. For example, POR circuits 711–713 and 600 can detect when VCCN[3, 4, 7, 8] reach a voltage required for 1.5/1.8 volt IO operation. Alternatively, the POR circuits can monitor when the supply voltages reach values required by different IO operation modes.

POR 600 determines when VCCN reaches the voltage selected by signal VCCSEL, as described above. The output signal of control circuit 701 transitions high only when the output signals of all four POR circuits 711–713 and 600 are high, indicating that supply voltages VCCN and VCCPD have reached the levels required by each I/O bank. The input and output buffers in I/O banks 3, 4, 7, and 8 are not enabled until the output signal of control circuit 701 is high.

Figure 8:
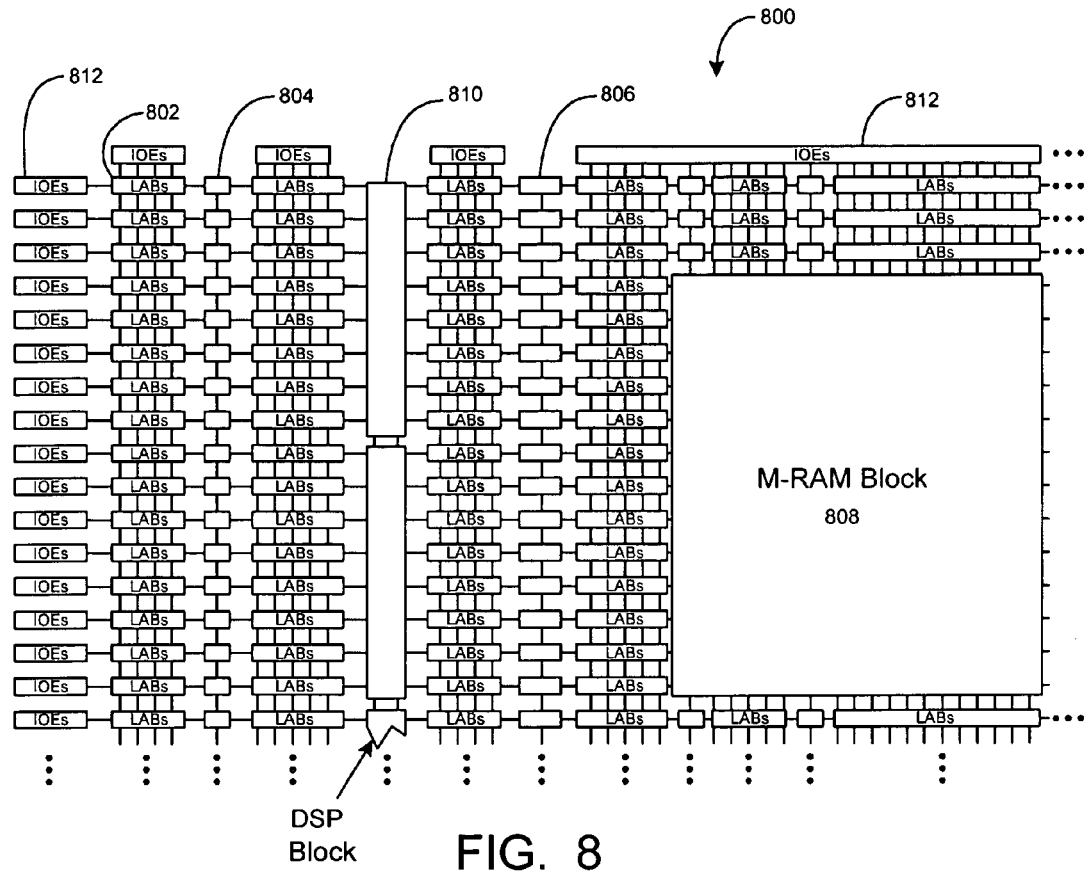
FIG. 8 is a simplified block diagram of a programmable logic device that can be used with the techniques of the present invention.

FIG. 8 is a simplified partial block diagram of one example of PLD 800 that can include aspects of the present invention. Although the present invention is discussed primarily in the context of PLDs and FPGAs, it should be understood that the present invention can be applied to numerous types of programmable logic integrated circuits.

PLD 800 is an example of a programmable logic integrated circuit in which techniques of the present invention can be implemented. PLD 800 includes a two-dimensional array of programmable logic array blocks (or LABs) 802 that are interconnected by a network of column and row interconnects of varying length and speed. LABs 802 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 800 also includes a distributed memory structure including RAM blocks of varying sizes provided throughout the array. The RAM blocks include, for example, 512 bit blocks 804, 4K blocks 806, and a block 808 providing 512K bits of RAM. These memory blocks can also include shift registers and FIFO buffers.

PLD 800 further includes digital signal processing (DSP) blocks 810 that can implement, for example, multipliers with add or subtract features. I/O elements (IOEs) 812 located, in this example, around the periphery of the device support numerous single-ended and differential I/O standards. It is to be understood that PLD 800 is described herein for illustrative purposes only and that the present invention can be implemented in many different types of PLDs, FPGAs, and the like.

Figure 9:
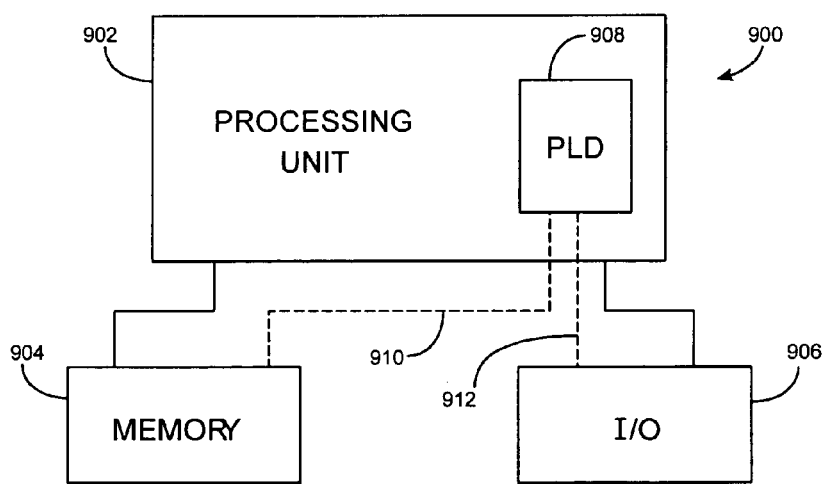
FIG. 9 is a block diagram of an electronic system that can implement embodiments of the present invention.

While PLDs of the type shown in FIG. 8 provide many of the resources required to implement system level solutions, the present invention can also benefit systems wherein a PLD is one of several components. FIG. 9 shows a block diagram of an exemplary digital system 900, within which the present invention can be embodied. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904 and an I/O unit 906 interconnected together by one or more buses. According to this exemplary embodiment, a programmable logic device (PLD) 908 is embedded in processing unit 902. PLD 908 can serve many different purposes within the system in FIG. 9. PLD 908 can, for example, be a logical building block of processing unit 902, supporting its internal and external operations. PLD 908 is programmed to implement the logical functions necessary to carry on its particular role in system operation. PLD 908 can be specially coupled to memory 904 through connection 910 and to I/O unit 906 through connection 912.

Processing unit 902 can direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 908 can control the logical operations of the system. In an embodiment, PLD 908 acts as a reconfigurable processor, which can be reprogrammed as needed to handle a particular computing task. Alternately, programmable logic device 908 can itself include an embedded microprocessor. Memory unit 904 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit having a plurality of input/output (I/O) banks, wherein a first one of the I/O banks comprises:
   a first set of configuration output pins;
   first buffers coupled to drive the first set of configuration output pins, wherein each of the first buffers are coupled to receive a first supply voltage;
   a second set of pins; and
   second buffers coupled to the second set of pins, wherein each of the second buffers is coupled to receive a second supply voltage that is independent of the first supply voltage,
   wherein the first I/O bank further comprises a dual mode input buffer that has a first driver coupled to receive the first supply voltage, and a second driver coupled to receive the second supply voltage, outputs of the first driver and second driver being coupled to a pin, and
   wherein a select signal enables the first driver or the second driver.

2. The programmable logic integrated circuit defined in claim 1 further comprising:
   a first power on reset circuit that determines when the first power supply voltage has reached a first voltage required for a first I/O operation when the first driver is enabled;
   a second power on reset circuit that determines when the first power supply voltage has reached a second voltage required for a second I/O operation when the second driver is enabled; and
   a third power on reset circuit that determines when the second power supply voltage has reached a third voltage required for a third I/O operation.

3. The programmable logic integrated circuit defined in claim 2 wherein the select signal blocks the output of one of the first power on reset circuit or the second power on reset circuit.

4. A programmable logic integrated circuit having a plurality of input/output (I/O) banks, wherein a first one of the I/O banks comprises:
   a first set of configuration output pins;
   first buffers coupled to drive the first set of configuration output pins, wherein each of the first buffers are coupled to receive a first supply voltage;
   a second set of pins; and
   second buffers coupled to the second set of pins, wherein each of the second buffers is coupled to receive a second supply voltage that is independent of the first supply voltage,
   wherein all of the configuration output pins on the integrated circuit are located in the first I/O bank and coupled to one of the first buffers.

5. The programmable logic integrated circuit defined in claim 4 wherein all optional output pins on the integrated circuit are located in the first I/O bank.

6. The programmable logic integrated circuit defined in claim 4 further comprising:
   a second I/O bank coupled to receive a third supply voltage that is less than the first supply voltage.

7. The programmable logic integrated circuit defined in claim 6 further comprising:
   a first power on reset circuit coupled to monitor the first supply voltage; and
   a second power on reset circuit coupled to monitor the second supply voltage.

8. The programmable logic integrated circuit defined in claim 7 further comprising:
   a third power on reset circuit coupled to monitor the third supply voltage.

9. The programmable logic integrated circuit defined in claim 8 further comprising:
   a control circuit coupled to output signals of the first, the second, and the third power on reset circuits and coupled to transmit a control signal to the first and the second I/O banks.

10. The programmable logic integrated circuit defined in claim 4 wherein the second supply voltage depends on what the configuration mode is.

11. The programmable logic integrated circuit defined in claim 4 wherein the first set of configuration output pins includes a JTAG output pin coupled to one of the first buffers.

12. A programmable logic integrated circuit having a plurality of input/output (I/O) banks, wherein a first one of the I/O banks comprises:
   a first set of configuration output pins;
   first buffers coupled to drive the first set of configuration output pins, wherein each of the first buffers are coupled to receive a first supply voltage;
   a second set of pins;
   second buffers coupled to the second set of pins, wherein each of the second buffers is coupled to receive a second supply voltage that is independent of the first supply voltage, the programmable logic integrated circuit further comprising:
   a second I/O bank coupled to receive the first supply voltage and a third supply voltage that is less than the first supply voltage.

13. The programmable logic integrated circuit defined in claim 12 wherein the second I/O bank further comprises:
   a third set of configuration output pins;
   third buffers coupled to drive the third set of configuration output pins, wherein each of the third buffers are coupled to receive the first supply voltage;
   a fourth set of pins; and
   fourth buffers coupled to the fourth set of pins, wherein each of the fourth buffers is coupled to receive the third supply voltage.

14. The programmable logic integrated circuit defined in claim 13 wherein the third set of configuration output pins includes a JTAG output pin driven by one of the third buffers.

15. A method of fabricating a programmable logic integrated circuit having a plurality of input/output (I/O) banks, the method comprising:
provided a first set of configuration output pins in a first I/O bank;
coupling first buffers in the first I/O bank to drive the first set of configuration output pins;
coupling each of the first buffers to a first supply voltage;
providing a second set of pins in the first I/O bank;
coupling second buffers in the first I/O bank to the second set of pins;
coupling each of the second buffers to a second supply voltage that is independent of the first supply voltage; and
providing a dual mode input buffer having a first driver coupled to receive the first supply voltage, and a second driver coupled to receive the second supply voltage, wherein outputs of the first and the second drivers are coupled to a pin in the first I/O bank.

16. The method according to claim 15 wherein the first set of configuration output pins includes a JTAG output pin coupled to one of the first buffers.

17. The method according to claim 15 wherein all of the configuration output pins on the integrated circuit are located in the first I/O bank and coupled to one of the first buffers.

18. The method according to claim 15 further comprising:
providing optional output pins that are all located in the first I/O bank.

19. The method according to claim 15 further comprising:
monitoring the first supply voltage using a first power on reset circuit; and
monitoring the second supply voltage using a second power on reset circuit.

20. The method according to claim 19 further comprising:
monitoring output signals of the first and the second power on reset circuits and generating a control signal that is transmitted to the first I/O bank.

* * * * *